US008654590B2

(12) United States Patent
Aritome et al.

(10) Patent No.: US 8,654,590 B2
(45) Date of Patent: Feb. 18, 2014

(54) NONVOLATILE MEMORY DEVICE PERFORMING A PROGRAM VERIFICATION WITH SENSE SIGNALS BASED ON PROGRAM DATA OF ADJACENT MEMORY CELLS AND PROGRAM METHOD THEREOF

(75) Inventors: Seiichi Aritome, Gyeonggi-do (KR); Soon Ok Seo, Gwangju (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 140 days.

(21) Appl. No.: 13/331,820

(22) Filed: Dec. 20, 2011

(65) Prior Publication Data

US 2012/0163093 A1 Jun. 28, 2012

(30) Foreign Application Priority Data

Dec. 24, 2010 (KR) .......................... 10-2010-0134639

(51) Int. Cl.
*G11C 16/34* (2006.01)

(52) U.S. Cl.
USPC ............ 365/185.22; 365/185.17; 365/185.02; 365/185.03

(58) Field of Classification Search
USPC ............. 365/185.17, 185.19, 185.22, 185.02, 365/185.03
See application file for complete search history.

(56) References Cited

U.S. PATENT DOCUMENTS

| 6,999,343 | B2 * | 2/2006 | Shim | 365/185.17 |
| 8,351,273 | B2 * | 1/2013 | Lee | 365/185.25 |
| 2010/0315883 | A1 * | 12/2010 | Lee | 365/185.25 |

FOREIGN PATENT DOCUMENTS

| KR | 1020090014527 | 2/2009 |
| KR | 1020100085658 | 7/2010 |
| KR | 1020110001573 | 1/2011 |

OTHER PUBLICATIONS

Notice of Allowance issued from the Korean Intellectual Property Office on Oct. 23, 2012.
Office Action issued from the Korean Intellectual Property Office on Apr. 24, 2012.

* cited by examiner

*Primary Examiner* — Andrew Q Tran
(74) *Attorney, Agent, or Firm* — IP & T Group LLP

(57) ABSTRACT

A programming method of a nonvolatile memory device includes inputting even data and odd data to be programmed into even memory cells coupled to even bit lines and odd memory cells coupled to odd bit lines, respectively, setting a sense signal as a first sense signal or a second sense signal having a lower voltage level than the first sense signal, based on odd data of odd memory cells adjacent to each of the even memory cells to be programmed, programming the even data into the even memory cells by supplying a program voltage, performing a program verify operation on each of the even memory cells in response to the set sense signal, and programming the odd data into the odd memory cells by supplying a program voltage.

16 Claims, 5 Drawing Sheets

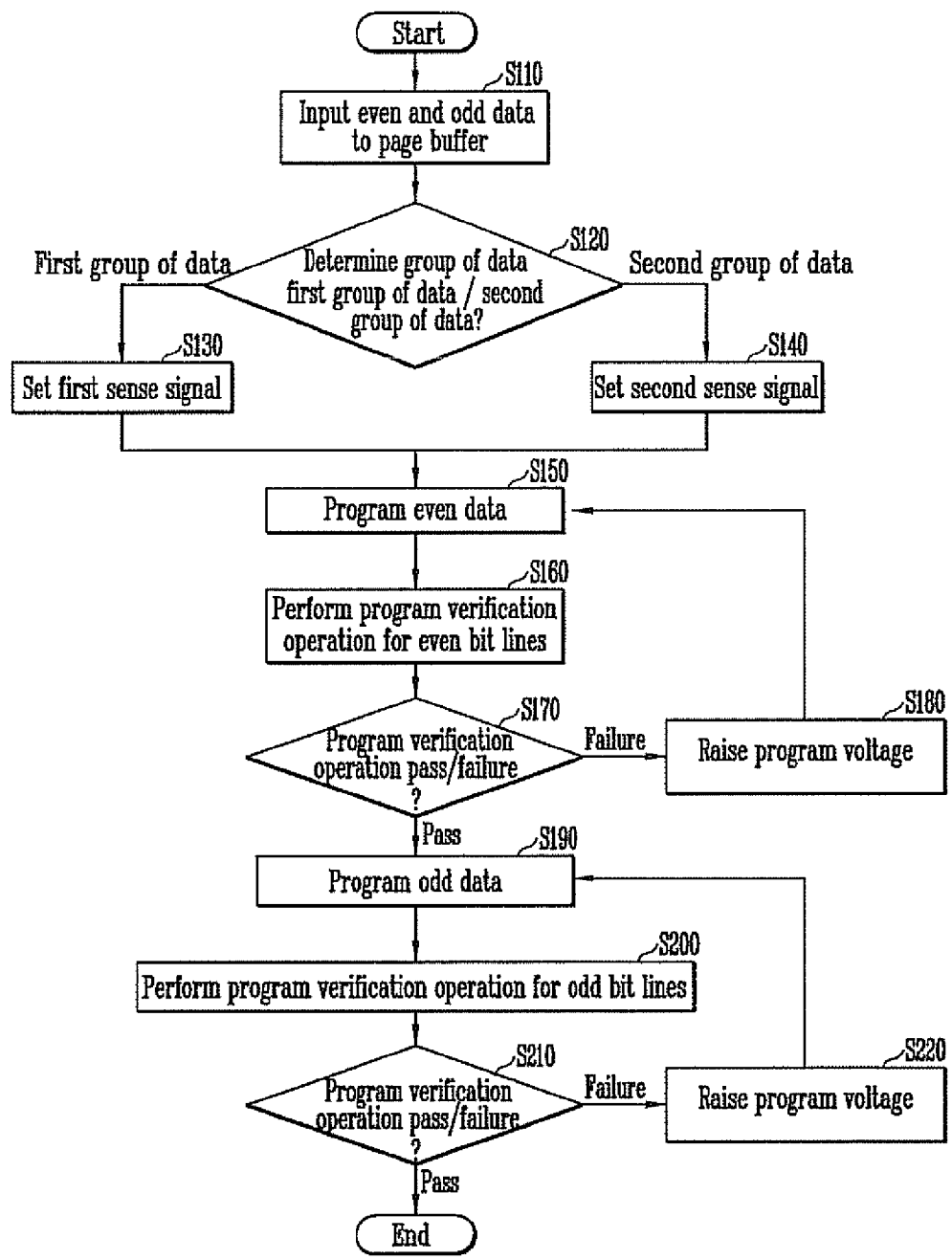

NONVOLATILE MEMORY DEVICE PERFORMING A PROGRAM VERIFICATION WITH SENSE SIGNALS BASED ON PROGRAM DATA OF ADJACENT MEMORY CELLS AND PROGRAM METHOD THEREOF

CROSS-REFERENCE TO RELATED APPLICATION

Priority to Korean patent application number 10-2010-0134639 filed on Dec. 24, 2010, the entire disclosure of which is incorporated by reference herein, is claimed.

BACKGROUND

Exemplary embodiments relate to a nonvolatile memory device and a program method thereof.

There is an increasing demand for nonvolatile memory devices which may be electrically programmed and erased without a refresh function of rewriting data at specific intervals.

Each of the memory cells of the nonvolatile memory device is an electrically programmable and erasable element.

The program and erase functions of the memory cell are performed in such a way that electrons within a thin oxide layer, e.g., about 100 Å in thickness, are moved by a strong electric field supplied to the oxide layer, thereby shifting the threshold voltages of the memory cell.

In the programming method of the nonvolatile memory device, various forms of interference phenomena are caused in a memory cell by shift in the threshold voltages of adjacent memory cells. In particular, in a multi-level cell (MLC) program method capable of storing data of 2 bits or more in one cell, a malfunction due to the interference phenomena may more frequently occur because a margin between the threshold voltages for the stored data is narrowed.

BRIEF SUMMARY

Exemplary embodiments relate to a nonvolatile memory device and a program method thereof, wherein one of a plurality of sense signals is selected by using a group of data to be programmed into memory cells adjacent to a selected memory cell along a relevant word line and a program verify operation is performed on the selected memory cell in response to the selected sense signal.

A nonvolatile memory device according to an aspect of the present disclosure includes a memory cell array; a plurality of page buffers each coupled to a plurality of bit lines of the memory cell array and configured to store data to be programmed into a selected memory cell and to sense a voltage level of each bit line in response to one of a plurality of sense signals when a program verification operation is performed; and a sense signal generation circuit coupled to the page buffers and configured to generate the plurality of sense signals having different voltage levels for the program verification operation.

A programming method of a nonvolatile memory device according to another aspect of the present disclosure includes inputting even data and odd data to be programmed into even memory cells coupled to even bit lines and odd memory cells coupled to odd bit lines, respectively; setting a sense signal as a first sense signal or a second sense signal having a lower voltage level than the first sense signal, based on odd data of odd memory cells adjacent to each of the even memory cells to be programmed; programming the even data into the even memory cells by supplying a program voltage; performing a program verify operation on each of the even memory cells in response to the set sense signal; programming the odd data into the odd memory cells by supplying a program voltage, if as a result of the program verify operation on the even memory cells, the even memory cells are determined to have passed; and performing a program verify operation on the odd memory cells in response to the second sense signal.

A programming method of a nonvolatile memory device according to yet another aspect of the present disclosure includes inputting data to be programmed into a plurality of memory cells coupled to bit lines, respectively; setting a sense signal as a first sense signal or a second sense signal having a lower voltage level than the first sense signal, based on data of memory cells adjacent to a selected memory cell to be programmed; performing a program operation on the selected memory cell by supplying a program voltage to the selected memory cell; and performing a program verification operation on the selected memory cell by supplying a program verification voltage to the selected memory cell by using the set sense signal.

BRIEF DESCRIPTION OF THE DRAWINGS

FIG. 2 is a flowchart illustrating the programming method of the nonvolatile memory device according to an embodiment of this disclosure;

DESCRIPTION OF EMBODIMENTS

Hereinafter, some exemplary embodiments of the present disclosure will be described in detail with reference to the accompanying drawings. The figures are provided to enable those of ordinary skill in the art to make and use the embodiments of the disclosure.

Figure 1:
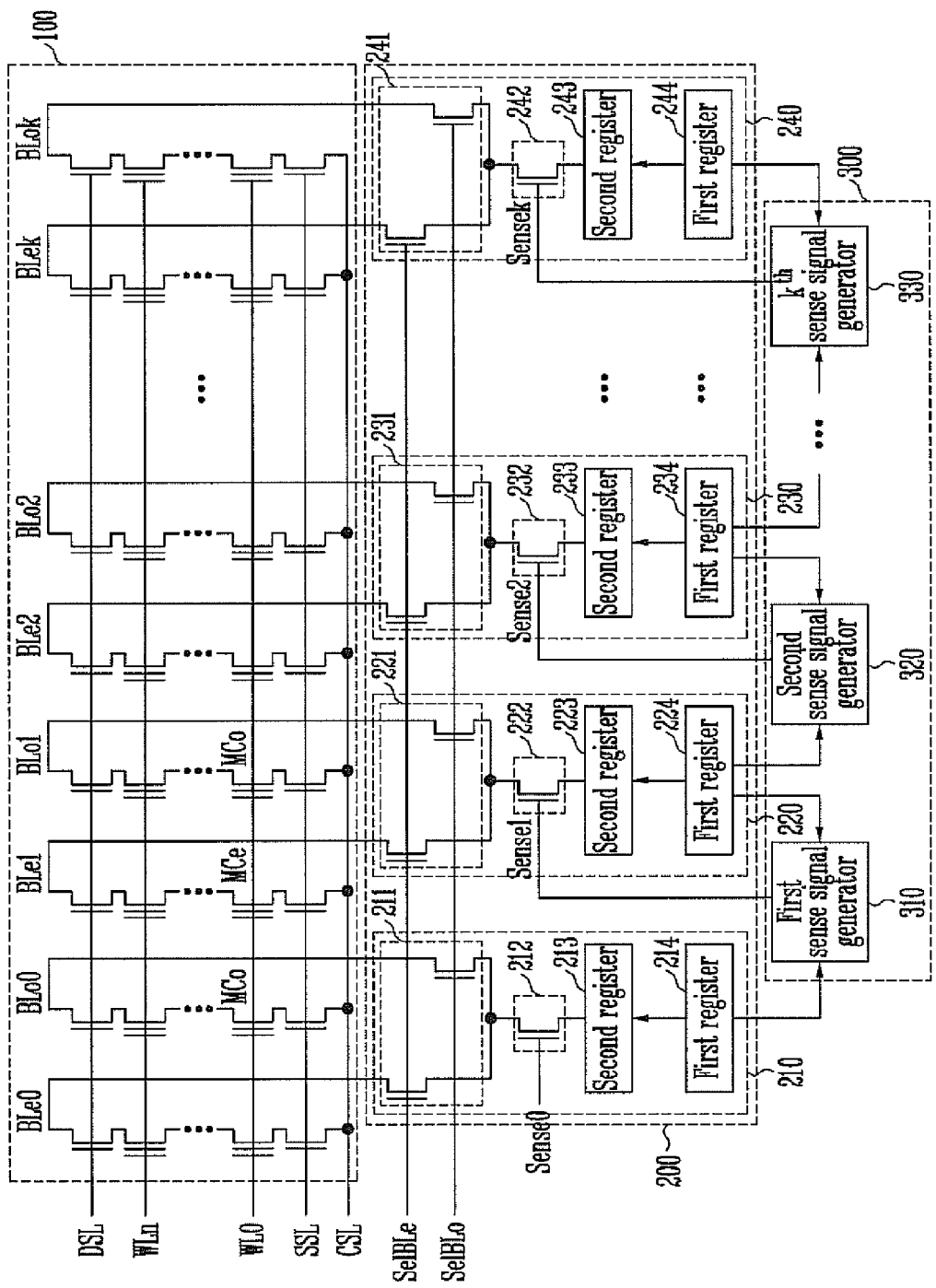
FIG. 1 shows the construction of a nonvolatile memory device according to an embodiment of this disclosure.

FIG. 1 shows the construction of a nonvolatile memory device according to an embodiment of this disclosure.

Referring to FIG. 1, the nonvolatile memory device includes a memory cell array 100, a page buffer unit 200, and a sense signal generation circuit 300.

The memory cell array 100 includes a plurality of even bit lines BLe0 to BLeK and a plurality of odd bit lines BLo0 to BLoK which are alternatively arranged. That is, an even bit line and an odd bit line form a bit line pair.

The page buffer unit 200 includes a plurality of page buffers 210 to 240. The plurality of page buffers 210 to 240 has the same construction, and thus only the page buffer 210 is described below as an example. The page buffer 210 is coupled to a bit line pair (that is, the even bit line BLe0 and the odd bit line BLo0). The page buffer 210 includes a bit line selection unit 211, a sense unit 212, a first register 214, and a second register 213.

The bit line selection unit 211 selects the even bit line BLe0 or the odd bit line BLo0 in response to an even bit line select signal SeIBLe or an odd bit line select signal SeIBLo and couples a selected bit line to the sense unit 212.

At the time of a program operation, the sense unit 212 transmits data, stored in the second register 213, to the selected bit line of the even bit line BLe0 and the odd bit line BLo0 in response to a sense signal Sense0. At the time of a program verification operation, the sense unit 212 senses a voltage level of the selected bit line of the even bit line BLe0 and the odd bit line BLo0 and transmits the sensed voltage level to the second register 213.

At the time of a program operation, the first register 214 receives even data to be programmed into a memory cell coupled to the even bit line BLe0, transmits the even data to the second register 213, receives odd data to be programmed into a memory cell coupled to the odd bit line BLo0, and temporarily stores the odd data. After a program operation for the even data is finished, the first register 214 transmits the odd data to the second register 213, receives new even data, and temporarily store the new even data.

At the time of a program operation, the second register 213 temporarily stores even data received from the first register 214 and transmits the even data to the sense unit 212. After a program operation for the even data is finished, the second register 213 receives odd data from the first register 214, temporarily stores the odd data, and transmits the odd data to the sense unit 212.

The sense signal generation circuit 300 includes first to $K^{th}$ sense signal generators 310 to 330. The first to $K^{th}$ sense signal generators 310 to 330 correspond to the respective page buffers 220 to 240 other than the page buffer 210.

At the time of a program verification operation for a memory cell coupled to the even bit line BLe1, the first sense signal generator 310 controls a voltage level of a sense signal Sense1 in response to odd data stored in the first register 214 of the page buffer 210 and an odd data stored in the first register 224 of the page buffer 220 and outputs the sense signal Sense1 having the controlled voltage level to the sense unit 222 of the page buffer 220. At the time of a program verification operation for a memory cell coupled to the odd bit line BLe1, the first sense signal generator 310 generates the sense signal Sense1 having a set voltage level. In other words, at the time of a program verification operation for a selected memory cell (for example, MCe) coupled to the even bit line (for example, BLe1), the first sense signal generator 310 controls a voltage level of the sense signal Sense1 in response to odd data to be programmed into the adjacent memory cells MCo coupled to the respective adjacent bit lines BLo0 and BLo1 and outputs the sense signal Sense1 having the controlled voltage level.

At the time of a program verification operation for a memory cell coupled to the even bit line BLe2, the second sense signal generator 320 controls a voltage level of the sense signal Sense2 in response to odd data stored in the first register 224 of the page buffer 220 and an odd stored in the first register 234 of the page buffer 230 and outputs the sense signal Sense2 having the controlled voltage level to the sense unit 232 of the page buffer 230.

As described above, at the time of a program verification operation for an even memory cell, i.e., a memory cell coupled to an even bit line, each of the sense signal generators 310 to 330 generates the sense signal by using odd data stored in a corresponding page buffer and an odd data stored in an adjacent page buffer and outputs the sense signal to the sense unit of the page buffer.

In the embodiment of this disclosure, it is described as an example that a program operation is performed on a memory cell coupled to the even bit line and a program operation is then performed on a memory cell coupled to the odd bit line. If the program operation is first performed on the memory cell coupled to the odd bit line, the sense signal generation circuit 300 generates the sense signal by using the even data of corresponding page buffers. This is evident to those skilled in the art, and thus a detailed description thereof is omitted.

Figure 3A:
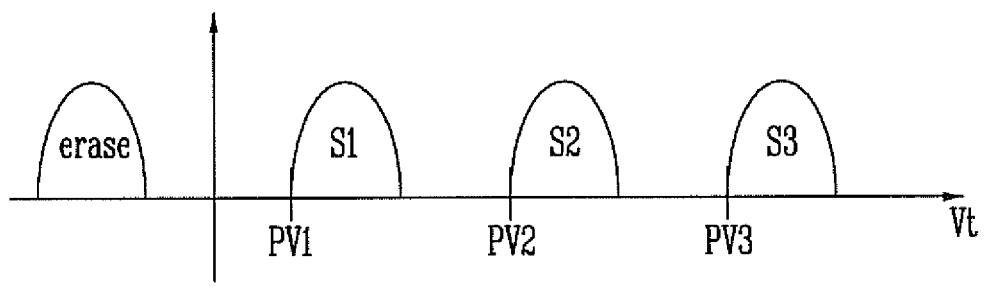
FIGS. 3A and 3B show the threshold voltage distributions of memory cells for illustrating the programming method of FIG. 2.
Figure 3B:
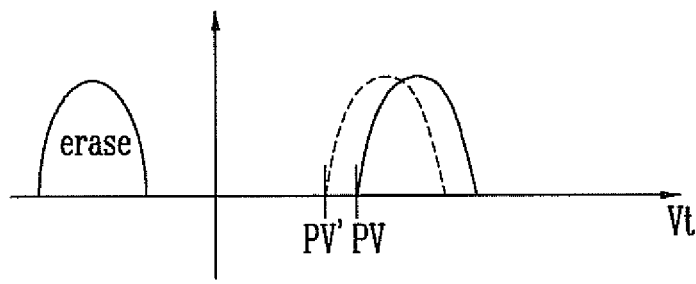

FIG. 2 is a flowchart illustrating the programming method of the nonvolatile memory device according to an embodiment of this disclosure. FIGS. 3A and 3B show the threshold voltage distributions of memory cells for illustrating the programming method of FIG. 2.

The programming method of the nonvolatile memory device according to the embodiment of this disclosure is described below with reference to FIGS. 1, 2, 3A, and 3B.

1) Input Data to Page Buffer (S110)

Even data to be programmed into memory cells coupled to the even bit lines and odd data to be programmed into memory cells coupled to the odd bit lines are inputted to the plurality of page buffers. The page buffer 210 is described below as an example. First, even data is inputted to the first register 214 of the page buffer 210. The even data inputted to the first register 214 is transferred to the second register 213. Next, odd data is inputted to the first register 214 and then temporarily stored.

2) Determine Group of Data to be Programmed into Adjacent Memory Cells (S120)

The sense signal generation circuit 300 determines a group of data to be programmed into memory cells adjacent to a selected memory cell which is coupled to an even bit line for a program. For example, the first sense signal generator 310 of the sense signal generation circuit 300 receives odd data to be programmed into the memory cells MCo, adjacent to the selected memory cell MCe along a word line WL0, from the first register 214 of the page buffer 210 and the first register 224 of the page buffer 220 and determines a group of data based on the received odd data. Here, it is determined whether the two odd data to be programmed into the memory cells MCo adjacent to the selected memory cell MCe belongs to a first group of data or a second group of data. The first group of data may include the odd data having certain combination of the distributions shown in FIG. 3A, such as the distributions of erase and S3, erase and S2, and S2 and S2, and the second group of data may include the odd data of the remaining combination other than the first group of data.

3) Set First Sense Signal (S130)

If, as a result of the determination at step S120, the two odd data is determined to belong to the first group of data, the sense signal generation circuit 300 selects a first sense signal having a higher voltage level than a second sense signal, from among the first sense signal and the second sense signal having different voltage levels, and outputs the first sense signal as the sense signal Sense1.

4) Set Second Sense Signal (S140)

If, as a result of the determination at step S120, the two odd data is determined to belong to the second group of data, the sense signal generation circuit 300 selects a second sense signal having a lower voltage level than a first sense signal, from among the first sense signal and the second sense signal having different voltage levels, and outputs the second sense signal as the sense signal Sense1.

5) Program Even Data (S150)

The bit line selection units of the page buffers couple the even bit lines BLe0 to BLeK to the respective sense units 212 to 242 in response to the even bit line select signal SelBLe. The sense units 212 to 242 couple the even bit lines BLe0 to BLeK to the second registers of the page buffers in response to the respective sense signals Sense0 to SenseK. Thus, voltage levels of the even bit lines BLeD to BLeK are changed depending on even data stored in the second registers, respectively. Next, when a program voltage is supplied to a word line WL0, memory cells coupled to the even bit lines BLeD to BLeK are programmed. Here, in order to prevent memory cells, coupled to the odd bit lines BLo0 to BLoK, from being programmed, the odd bit lines BLo0 to BLoK preferably are maintained to have a power supply voltage level.

6) Perform Program Verification Operation for Even Bit Lines (S160)

Each of the first to $K^{th}$ sense signal generators 310 to 330 of the sense signal generation circuit 300 generates the first sense signal or the second sense signal.

The bit line selection units of the page buffers couple the even bit lines BLe0 to BLeK to the respective sense units of the page buffers in response to the even bit line select signal SeIBLe.

The sense units 212 to 242 of the page buffers sense voltage levels of the even bit lines BLe0 to BLeK in response to the sense signal Sense1 to SenseK, each set as the first sense signal or the second sense signal, and store the sensed voltage levels in the second registers, respectively. Here, it is preferred that the sense signal Sense0 supplied to the page buffer 210 be the second sense signal. This is because the memory cells coupled to the even bit line BLe0 experience less interference phenomena than the memory cells coupled to the remaining even bit lines.

7) Determine Result of the Program Verification Operation (S170)

A result of the program verification operation for the even bit line (S160) is determined. This is described in more detail below.

Referring to FIG. 3B, if a program verification operation is performed by using a sense signal set as the first sense signal, when a threshold voltage distribution is equal to or higher than a threshold voltage value PV' lower than a target threshold voltage value PV, the program verification operation is determined to be a pass. When the threshold voltage distribution is lower than the threshold voltage value PV', the program verification operation is determined to be a failure. If a program verification operation is performed by using a sense signal set as the second sense signal, when a threshold voltage distribution is equal to or higher than the target threshold voltage value PV, the program verification operation is determined to be a pass. If the threshold voltage distribution is lower than the target threshold voltage value PV, the program verification operation is determined to be a failure.

This is because a sensed voltage level of the even bit line is changed depending on a voltage level of the sense signal. For example, if a voltage level of the sense signal rises, threshold voltage values of memory cells are determined to have reached the target threshold voltage value PV although the threshold voltage values of the memory cells have the threshold voltage value PV' lower than the target threshold voltage value PV. Accordingly, if the memory cells are programmed with the threshold voltage value PV' lower than the target threshold voltage value PV, a program verification operation for the memory cells is determined to be a pass.

8) Raise Program Voltage (S180)

If, as a result of the determination at step S170, the program verification operation is determined to be a failure, the program voltage supplied to the word line WL0 is raised by a step voltage, and the process returns to step S150 where the even data program operation is performed again.

9) Program Odd Data (S190)

If, as a result of the determination at step S170, the program verification operation is determined to be a pass, an odd data program operation is performed.

First, odd data stored in the first registers of the page buffers is transmitted to the second registers. Next, the bit line selection units of the page buffers couple the odd bit lines BLo0 to BLoK to the respective sense units 212 to 242 in response to the odd bit line select signal SeIBLo. The sense units 212 to 242 couple the second registers of the page buffers to the respective odd bit lines BLo0 to BLoK in response to the respective sense signals Sense0 to SenseK. Thus, voltage levels of the odd bit lines BLo0 to BLoK are changed depending on respective odd data stored in the second registers. Next, when the program voltage is supplied to the word line WL0, memory cells coupled to the odd bit lines BLo0 to BLoK are programmed. Here, in order to prevent memory cells coupled to the even bit lines BLe0 to BLeK from being programmed, it is preferred that the even bit lines BLe0 to BLeK be maintained to have a power supply voltage level.

Referring to FIG. 3B, at the time of the odd data program operation, if data programmed into memory cells coupled to the odd bit lines belongs to the first group of data, the threshold voltage values of memory cells coupled to adjacent even bit lines rise higher than the target threshold voltage value PV owing to a coupling effect.

10) Perform Program Verification Operation for Odd Bit Lines (S200)

The sense signal generation circuit 300 outputs sense signals Sense0 to SenseK which are set as the second sense signal. The sense units of the page buffers determine whether the threshold voltage values of the memory cells coupled to the odd bit lines BLo0 to BLoK have been programmed with the target threshold voltage value or higher by sensing voltage levels of the respective odd bit lines BLo0 to BLoK coupled thereto through the bit line selection units in response to the respective sense signals Sense0 to SenseK.

11) Determine Result of Verification Operation (S210)

A result of the program verification operation for the odd bit line (S200) is determined at step S210. If, as a result of the program verification operation at step S200, the threshold voltage values of the memory cells coupled to the odd bit lines BLo0 to BLoK are determined to have been programmed with the target threshold voltage value, it is determined to be a pass. If the threshold voltage values of one or more of the memory cells are lower than the target threshold voltage value, it is determined to be a failure. If a result of the program verification operation is determined to be a pass, the program operation is terminated.

12) Raise Program Voltage (S220)

If, as a result of the determination of step S210, the program verification operation is determined to be a failure, the program voltage is raised by a step voltage, and the process returns to step S190 where the odd data program operation is performed again.

In the embodiment of this disclosure, an example where a voltage level of a sense signal used in a program verification operation on selected memory cells is changed depending on data to be programmed into memory cells adjacent to the selected memory cells has been described. However, the same effect may be obtained by changing timing at which the sense signal is supplied to the sense unit, instead of the voltage level of the sense signal. For example, as the sense signal is supplied to the sense unit for a longer period, the memory cell is detected to have a relatively higher threshold voltage distribution because a sense section is extended and the amount of sense current is increased. In this case, the same effect as the voltage level of the sense signal is raised may be obtained.

In the embodiment of this disclosure, an example where a voltage level of a sense signal used in a program verification operation on selected memory cells is changed depending on data to be programmed into memory cells adjacent to the selected memory cells has been described. However, the same effect may be obtained by changing timing at which the sense signal is supplied to the sense unit, instead of the voltage level of the sense signal. For example, as the sense signal is supplied to the sense unit for corresponding PV level read period or PV' level read period. In this case, the same effect as the voltage level of the sense signal is raised may be obtained.

Figure 4:
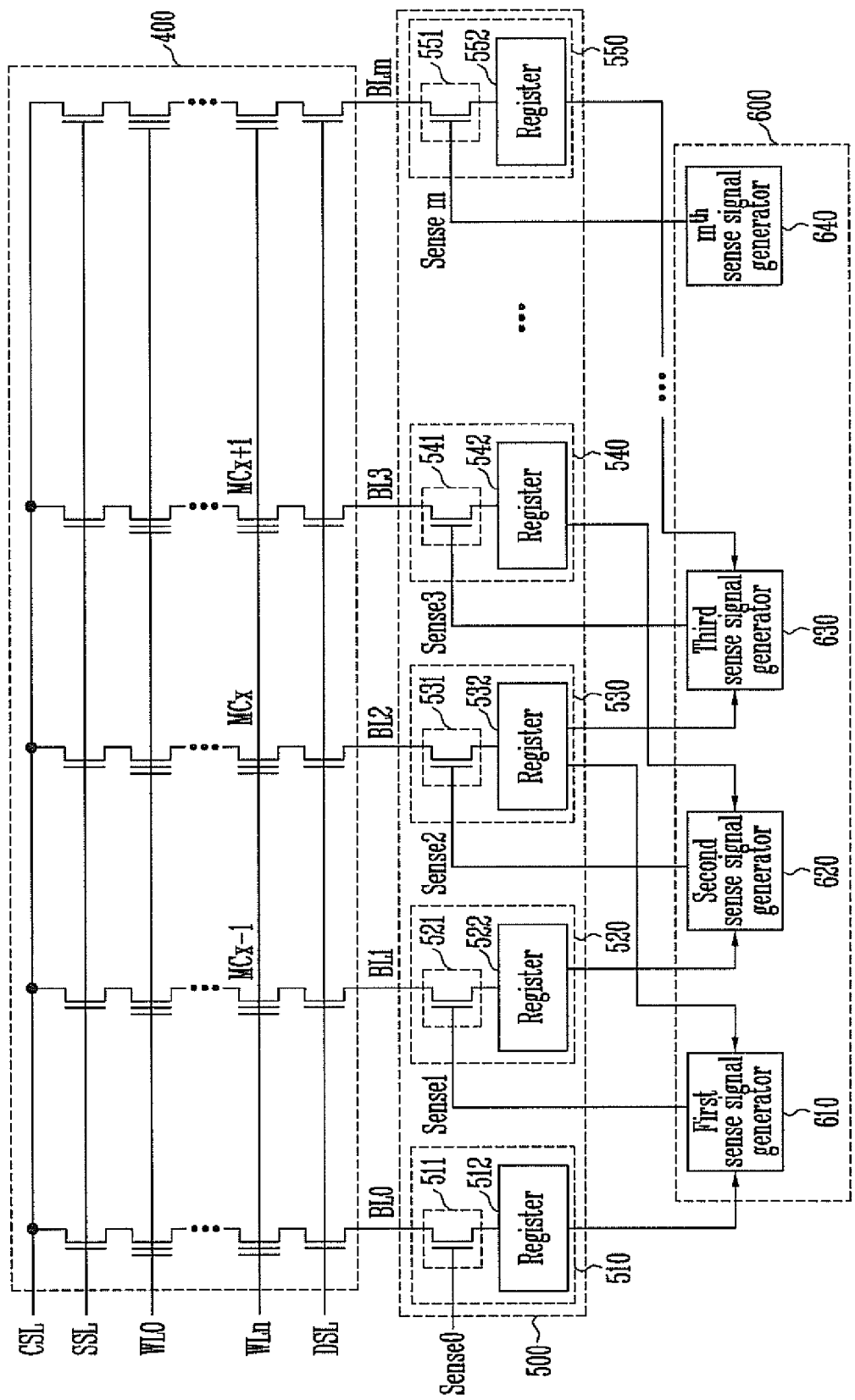
FIG. 4 shows the construction of a nonvolatile memory device according to another embodiment of this disclosure.

FIG. 4 shows the construction of a nonvolatile memory device according to another embodiment of this disclosure.

Referring to FIG. 4, the nonvolatile memory device includes a memory cell array 400, a page buffer unit 500, and a sense signal generation circuit 600.

The memory cell array 400 includes a plurality of memory cells coupled between a common source line CSL and a plurality of bit lines BL0 to BLm.

The page buffer unit 500 includes a plurality of page buffers 510 to 550. The page buffers 510 to 550 are coupled to the respective bit lines BL0 to BLm of the memory cell array 400. That is, one page buffer is coupled to one bit line. The page buffers 510 to 550 have the same construction, and thus only the page buffer 510 is described below as an example. The page buffer 510 is coupled to the bit line BL0. The page buffer 510 includes a sense unit 511 and a register 512.

At the time of a program operation, the sense unit 511 transmits data, stored in the register 512, to the bit line BL0 in response to a sense signal Sense0. At the time of a program verification operation, the sense unit 511 senses a voltage level of the bit line BL0 and transmits the sensed voltage level to the register 512.

At the time of a program operation, the register 512 receives data to be programmed into memory cells coupled to the bit line BL0, temporarily stores the received data, and transmits the stored data to the sense unit 511.

The sense signal generation circuit 600 includes first to $m^{th}$ sense signal generators 610 to 640. The first to $m^{th}$ sense signal generators 610 to 640 correspond to the respective page buffers 520 to 550 other than the page buffer 510.

At the time of a program verification operation on the memory cells coupled to the bit line BL1, the first sense signal generator 610 controls a voltage level of a sense signal Sense1 in response to data stored in the register 512 of the page buffer 510 and a data stored in the register 532 of the page buffer 530 and outputs the sense signal Sense1 having the controlled voltage level to the sense unit 521 of the page buffer 520. In other words, the first sense signal generator 610 generates the sense signal Sense1 used in a program verification operation for the page buffer 520 by using data temporarily stored in the page buffers 510 and 530 adjacent to the relevant page buffer 520.

At the time of a program verification operation on memory cells coupled to the bit line BL2, the second sense signal generator 620 controls a voltage level of a sense signal Sense2 in response to data stored in the register 522 of the page buffer 520 and a data stored in the register 542 of the page buffer 540 and outputs the sense signal Sense2 having the controlled voltage level to the sense unit 531 of the page buffer 530. In other words, the second sense signal generator 620 generates a sense signal Sense2 used in a program verification operation for the page buffer 530 by using data temporarily stored in the page buffers 520 and 540 adjacent to the relevant page buffer 530.

As described above, each of the sense signal generators 610 to 640 generates the sense signal supplied to the relevant page buffer by using data stored in page buffers adjacent to the relevant page buffer.

Here, the generated sense signal is controlled depending on data patterns of the data stored in the adjacent page buffers. More particularly, it is preferred that the sense signals having different voltage levels be generated or the activation sections of the sense signals be controlled depending on whether data stored in adjacent page buffers belongs to the first group of data, including the erase state and the state S3, the erase state and the state 52, or the state S2 and the state S2 of the distributions shown in FIG. 3A, or the second group of data including data other than the first group of data.

Figure 5:
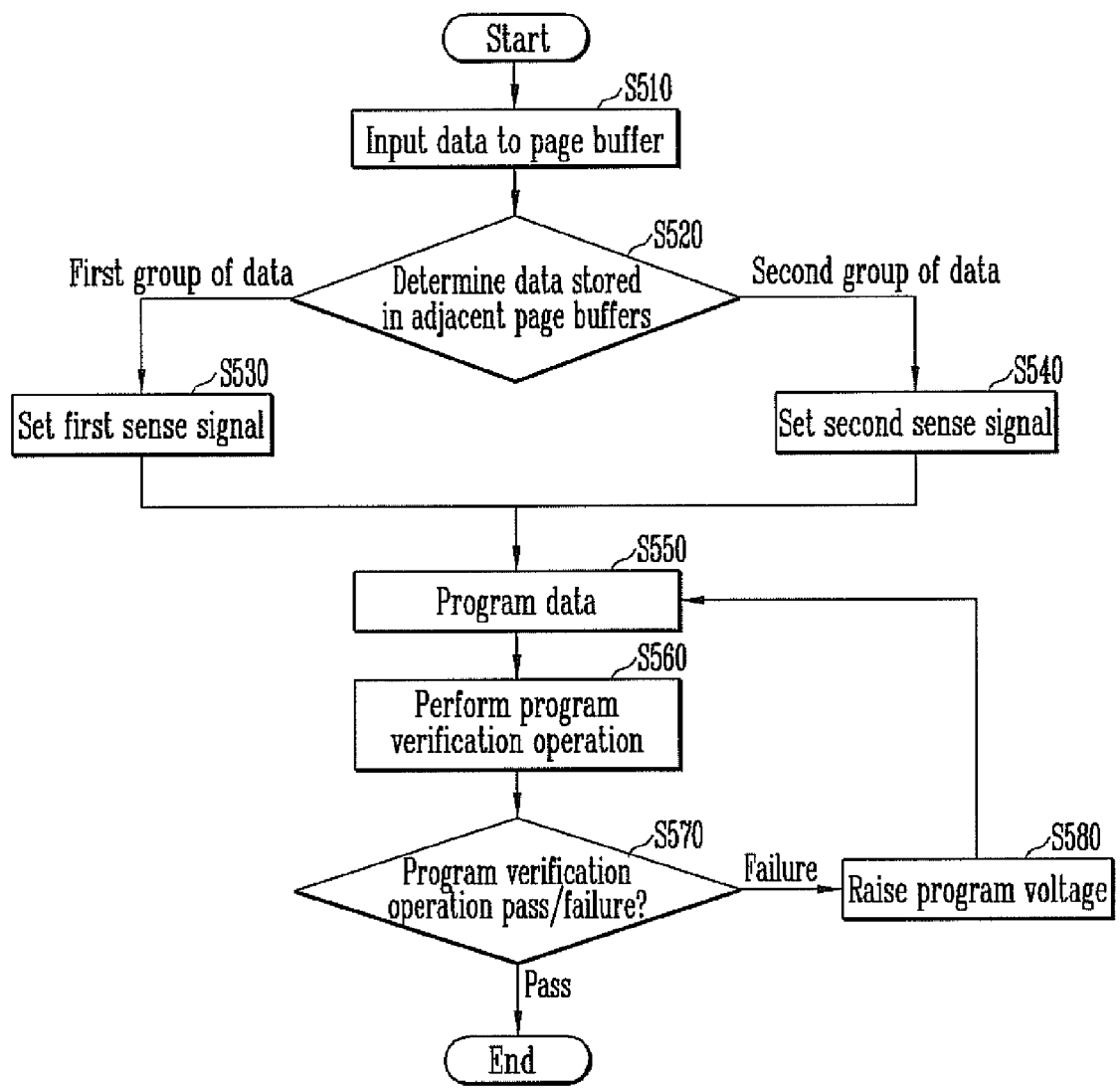
FIG. 5 is a flowchart illustrating the programming method of the nonvolatile memory device according to another embodiment of this disclosure

The programming method of the nonvolatile memory device according to another embodiment of this disclosure is described below with reference to FIG. 4 and FIG. 5.

1) Input Data to Page Buffer (S510)

Data to be programmed into the memory cells coupled to the bit lines BL0 to BLm is inputted to the page buffers. The page buffer 530 is described below as an example. Data to be programmed into a selected memory cell MCx coupled to the bit line BL2 is inputted to the register 532 of the page buffer 530.

2) Analyze Data Stored in Adjacent Page Buffers (S520)

The sense signal generation circuit 600 determines a group of data to be programmed into memory cells MCx−1 and MCx+1 adjacent to the selected memory cell MCx coupled to the bit line BL2. Here, the sense signal generation circuit 600 determines whether the data to be programmed into memory cells MCx−1 and MCx+1 adjacent to the selected memory cell MCx belongs to the first group of data, including the erase state and the state S3, the erase state and the state 52, or the state S2 and the state S2 of the distributions shown in FIG. 3A, or the second group of data including data other than the first group of data.

3) Set First Sense Signal (S530)

If, as a result of the determination at step S520, the data stored in the adjacent page buffers is determined to belong to the first group of data, the second sense signal generator 620 selects a first sense signal having a higher voltage level than a second sense signal, from among the first sense signal and the second sense signal having different voltage levels, and outputs the first sense signal as the sense signal Sense1.

4) Set Second Sense Signal (S540)

If, as a result of the determination at step S520, the data stored in the adjacent page buffers is determined to belong to the second group of data, the second sense signal generator 620 selects a second sense signal having a lower voltage level than a first sense signal, from among the first sense signal and the second sense signal having different voltage levels, and outputs the second sense signal as the sense signal Sense1.

5) Program Data (S550)

Voltage levels of the bit lines are controlled depending on values of data stored in the registers of the page buffers so that each of the voltage levels has 0 V or a power supply voltage level, and the memory cells coupled to the bit lines BL0 to BLm are programmed by supplying a program voltage to a word line WLn.

6) Perform Verification Operation Using Sense Signal (S560)

Threshold voltage values of the memory cells coupled to the bit lines BL0 to BLm are incorporated into voltage levels of the bit lines BL0 to BLm by supplying a verification voltage to the word lines WLn. Next, the sense units 511 to 551 of the page buffers sense voltage levels of the bit lines BL0 to BLm in response to the sense signal Sense0 which is set as the first sense signal or the second sense signal and the sense signals Sense1 to Sensem which are newly set and store the sensed voltage levels in the respective registers. Here, the sense signal Sense0 supplied to the page buffer 510 may be set as the second sense signal. This is because the memory cells coupled to the bit line BL0 experience less interference phenomena than the memory cells coupled to the remaining bit lines.

7) Determine Result of Program Verification Operation (S570)

A result of the program verification operation at step S560 is determined. This is described below in more detail.

If the program verification operation is performed by using the first sense signal having a higher voltage level than the second sense signal, when a threshold voltage distribution is equal to or higher than a set threshold voltage value lower than a target threshold voltage value, the program verification operation is determined to be a pass. When the threshold voltage distribution is lower than the set threshold voltage value, the program verification operation is determined to be a failure. If the program verification operation is performed by using the second sense signal, when the threshold voltage distribution is equal to or higher than the target threshold voltage value, the program verification operation is determined to be a pass. When the threshold voltage distribution is lower than the target threshold voltage value, the program verification operation is determined to be a failure.

This is because a sensed voltage level of the bit line is changed depending on a voltage level of a sense signal. For example, if the voltage level of a sense signal rises, threshold voltage values of memory cells are determined to have reached the target threshold voltage value although the threshold voltage values of the memory cells have the set threshold voltage value lower than the target threshold voltage value. Accordingly, if the memory cells are programmed with threshold voltage values lower than the target threshold voltage value, a program verification operation for the memory cells is determined to be a pass.

8) Raise Program Voltage (S580)

If, as a result of the determination at step S570, one or more of the memory cell are determined to be a failure, the program voltage supplied to the word line WLn is raised by a step voltage, and the process returns to step S550 where the data program operation is performed again.

Next, second and third program verification operations in each of which the verification voltage used in the program verification operation at step S560 is raised, a program verification operation is performed, and a result of the program verification operation is determined may be further performed.

As described above, according to this disclosure, a selected memory cell is programmed with a threshold voltage value lower than a target threshold voltage value by controlling a voltage level or an activation period of a sense signal used in a program verification operation performed on the selected memory cell when a certain group of data is to be programmed into memory cells adjacent to the selected memory cell along a relevant word line, and the threshold voltage value of the selected memory cell is raided to a target threshold voltage value by a coupling effect at the time of a program operation on the adjacent memory cells. Accordingly, the selected memory cell may be prevented from being over-programmed even if a threshold voltage distribution of the selected memory cell rises owing to interference phenomena in the program operation performed on adjacent memory cells.

Furthermore, one of sense signals is selected by using a group of data to be programmed into memory cells adjacent to a selected memory cell along a relevant word line, a program verify operation is performed on the selected memory cell in response to the selected sense signal, and the selected memory cell is programmed with a threshold voltage value which is equal to or higher than a target threshold voltage value or lower than the target threshold voltage value. Accordingly, the selected memory cell may be prevented from being over-programmed even if the threshold voltage distribution of the selected memory cell is raised by interference phenomena at the time of a subsequent program operation on the adjacent memory cells.

What is claimed is:

1. A programming method of a nonvolatile memory device, comprising:
    inputting even data and odd data to be programmed into even memory cells coupled to even bit lines and odd memory cells coupled to odd bit lines, respectively;
    setting a sense signal as a first sense signal or a second sense signal having a lower voltage level than the first sense signal, based on odd data of odd memory cells adjacent to each of the even memory cells to be programmed;
    programming the even data into the even memory cells by supplying the program voltage;
    performing a program verify operation on each of the even memory cells in response to the set sense signal;
    programming the odd data into the odd memory cells by supplying the program voltage, if as a result of the program verify operation on the even memory cells, the even memory cells are determined to have passed; and
    performing a program verify operation on the odd memory cells in response to the second sense signal.

2. The programming method of claim 1, further comprising programming the even data again by raising the program voltage by a step voltage, if as the result of the program verify operation on the even memory cells, the even memory cells are determined to have failed.

3. The programming method of claim 1, further comprising programming the odd data again by raising the program voltage by a step voltage, if as a result of the program verify operation on the odd memory cells, the odd memory cells are determined to have failed.

4. The programming method of claim 1, wherein the first sense signal has a longer activation time than the second sense signal.

5. The programming method of claim 1, wherein, in the setting of the sense signal, the sense signal is set as the first sense signal when the odd data of the adjacent odd memory cells correspond to first and second distributions among threshold voltage distributions of a programmed memory cell,
    wherein the first and second distributions includes:
        a highest voltage level distribution and a lowest voltage level distribution of the threshold voltage distributions, respectively;
        a next high voltage level distribution lower than the highest voltage level distribution and the lowest voltage level distribution of the threshold voltage distributions, respectively; or
        the next high voltage level distribution lower than the highest voltage level distribution for each of the first and second distributions.

6. A programming method of a nonvolatile memory device, comprising:
    inputting data to be programmed into a plurality of memory cells coupled to bit lines, respectively;
    setting a sense signal as a first sense signal or a second sense signal having a lower voltage level than the first sense signal, based on data of memory cells adjacent to a selected memory cell to be programmed;
    performing a program operation on the selected memory cell by supplying a program voltage to the selected memory cell; and performing a program verification operation on the selected memory cell by supplying a program verification voltage to the selected memory cell by using the set sense signal.

7. The programming method of claim 6, further comprising performing the program operation again by raising the program voltage by a step voltage, if a result of the program verification operation, the selected memory is determined to have failed.

8. The programming method of claim 6, wherein, in the setting of the sense signal, the sense signal is set as the first sense signal when the data of the adjacent memory cells correspond first and second distributions among threshold voltage distributions of a programmed memory cell, wherein the first and second distributions includes:
a highest voltage level distribution and a lowest voltage level distribution of the threshold voltage distributions, respectively;
a next high voltage level distribution lower than the highest voltage level distribution and the lowest voltage level distribution of the threshold voltage distributions, respectively; or
the next high voltage level distribution lower than the highest voltage level distribution for each of the first and second distributions.

9. The programming method of claim 6, further comprising performing the program verification operation again by raising the program verification voltage, after the performing of the program verification operation.

10. A nonvolatile memory device, comprising:
a memory cell array;
a plurality of page buffers each coupled to a plurality of bit lines of the memory cell array and configured to store data to be programmed into a selected memory cell and to sense a voltage level of each bit line in response to one of a plurality of sense signals when a program verification operation is performed; and
a sense signal generation circuit coupled to the page buffers and configured to generate the plurality of sense signals having different voltage levels for the program verification operation.

11. The nonvolatile memory device of claim 10, wherein the sense signal generation circuit sets the sense signal for the selected memory cell as one of a first sense signal and a second sense signal having a lower voltage level than the first sense signal, based on program states of memory cells adjacent to the selected memory cell.

12. The nonvolatile memory device of claim 11, wherein:
the sense signal generation circuit comprises a plurality of sense signal generators, and
the plurality of sense signal generators correspond to respective page buffers other than a page buffer placed at an end among the plurality of page buffers.

13. The nonvolatile memory device of claim 12, wherein each of the sense signal generators generates a corresponding sense signal by using data stored in page buffers adjacent to a corresponding page buffer.

14. The nonvolatile memory device of claim 13, wherein each of the sense signal generators sets the corresponding sense signal as the first sense signal, when the data stored in the adjacent memory cells correspond first and second distributions among threshold voltage distributions of a programmed memory cell, wherein the first and second distributions includes:
a highest voltage level distribution and a lowest voltage level distribution of the threshold voltage distributions, respectively;
a next high voltage level distribution lower than the highest voltage level distribution and the lowest voltage level distribution of the threshold voltage distributions, respectively; or
the next high voltage level distribution lower than the highest voltage level distribution for each of the first and second distributions.

15. The nonvolatile memory device of claim 10, wherein the sense signal generation circuit sets the sense signal for the selected memory cell as one of a first sense signal and a second sense signal having a shorter activation period than the first sense signal, based on program states of memory cells adjacent to the selected memory cell.

16. The nonvolatile memory device of claim 10, wherein each of the plurality of page buffers comprises:
a sense unit configured to sense the voltage level of the bit line connected to the sense unit in response to one of the sense signals; and
a register configured to store one of the data.

* * * * *